(12) United States Patent
Park et al.

(10) Patent No.: US 9,912,168 B2
(45) Date of Patent: Mar. 6, 2018

(54) WIRELESS POWER TRANSMITTING APPARATUS AND WIRELESS POWER RECEIVING APPARATUS

(71) Applicant: LG INNOTEK CO., LTD., Seoul (KR)

(72) Inventors: Yu Ri Park, Seoul (KR); Dong Hyuk Lee, Seoul (KR); Sang Hak Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 420 days.

(21) Appl. No.: 14/606,613

(22) Filed: Jan. 27, 2015

(65) Prior Publication Data

US 2015/0214749 A1 Jul. 30, 2015

Related U.S. Application Data

(60) Provisional application No. 61/932,258, filed on Jan. 28, 2014.

(51) Int. Cl.
| | |
|---|---|
| *H02J 5/00* | (2016.01) |
| *G01R 33/07* | (2006.01) |
| *H02J 7/02* | (2016.01) |
| *H01F 38/14* | (2006.01) |
| *H02J 50/90* | (2016.01) |

(52) U.S. Cl.
CPC ............. *H02J 5/005* (2013.01); *G01R 33/07* (2013.01); *G01R 33/072* (2013.01); *H01F 38/14* (2013.01); *H02J 7/025* (2013.01); *H02J 50/90* (2016.02)

(58) Field of Classification Search
CPC ...................................................... H02J 5/005
See application file for complete search history.

(56) References Cited

U.S. PATENT DOCUMENTS 8,669,678 B2 * 3/2014 Urano .................... H02J 5/005
307/104
8,901,881 B2 * 12/2014 Partovi ................ H01F 7/0252
320/108

* cited by examiner

*Primary Examiner* — Hai L Nguyen
(74) *Attorney, Agent, or Firm* — Birch, Stewart, Kolasch & Birch, LLP

(57) ABSTRACT

A wireless power transfer system is disclosed. A wireless power transmitting apparatus for wirelessly transmitting power to a wireless power receiving apparatus includes a transmitting coil for transmitting the power, a hall sensor for sensing a change width of flux density caused by the wireless power receiving apparatus, and a controller for comparing the sensed change width of the flux density with a predetermined critical value to determine whether to transmit the power, wherein magnets provided in the wireless power transmitting apparatus and the wireless power receiving apparatus are disposed such that polarities of the magnets are different from each other at opposite faces thereof. In the wireless power transfer system, the magnets having polarities are disposed in the wireless power transmitting apparatus and the wireless power receiving apparatus.

9 Claims, 15 Drawing Sheets

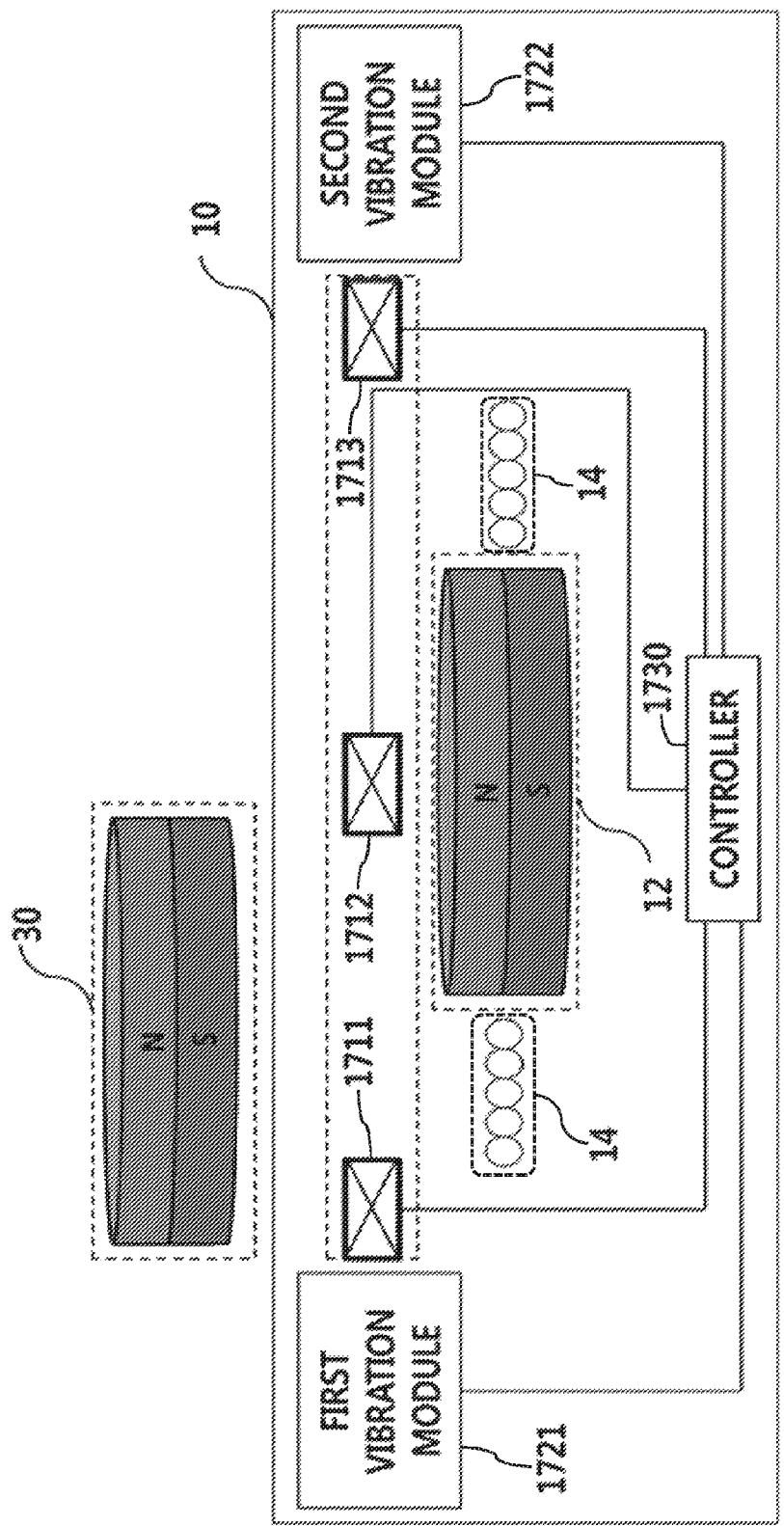

WIRELESS POWER TRANSMITTING APPARATUS AND WIRELESS POWER RECEIVING APPARATUS

CROSS REFERENCE TO RELATED APPLICATION

This application claims priority under 35 U.S.C. § 119 to U.S. Provisional Application No. 61/932,258, filed in U.S. on Jan. 28, 2014, which is hereby incorporated in its entirety by reference as if fully set forth herein.

TECHNICAL FIELD

Embodiments relate to wireless power transfer. More specifically, embodiments relate to a wireless power transmitting apparatus capable of wirelessly transmitting electric energy and a wireless power receiving apparatus capable of wirelessly receiving electric energy.

BACKGROUND

With rapid development of information communication technology in recent years, we are moving toward a ubiquitous society based on the information communication technology.

In order to access information communication devices anytime anywhere, it is necessary to install sensors each having a computer chip capable of performing a communication function in all social facilities. Consequently, the supply of power to the devices and sensors is a new issue. In addition, as kinds of portable devices, such as a mobile phone, a Bluetooth headset, and an iPod music player, have been increased, it takes time and efforts for users to charge batteries. In recent years, wireless power transfer has attracted attention as a method of solving this problem.

Wireless power transmission or wireless energy transfer refers to a technology of wirelessly transferring electric energy from a transmitter to a receiver using a principle of magnetic induction. In the 1800's, an electric motor or a transformer employing a principle of electromagnetic induction had been used, and afterward a method for transmitting electric energy by emitting electromagnetic waves, such as radio waves or lasers, has been attempted. Actually, electrical toothbrushes or electrical razors, which are frequently used in daily life, are charged based on the principle of electromagnetic induction.

Wireless energy transfer schemes used until now may be divided into a magnetic induction scheme, an electromagnetic resonance scheme, and a power transfer scheme using a short-wavelength radio frequency.

The magnetic induction scheme is a technology using a phenomenon in which when two coils are disposed adjacent to each other and current is supplied to one of the coil, a magnetic flux is generated and, as a result, electromotive force is generated in the other coil. The magnetic induction scheme is being rapidly commercialized for small-sized devices, such as a mobile phone. The magnetic induction scheme has an advantage in that it is possible to transfer power of a maximum of several hundreds of kilowatts (kW) with high efficiency. However, the magnetic induction scheme has a disadvantage in that the maximum transfer distance is 1 cm or less and thus coils must be disposed adjacent to a charger or the bottom of a mobile phone.

The electromagnetic resonance scheme is characterized by using an electric field or a magnetic field instead of utilizing an electromagnetic wave or current. The electromagnetic resonance scheme has an advantage in that the electromagnetic resonance scheme is not affected by the electromagnetic wave and is thus safe for other electronic devices and human bodies. However, the electromagnetic resonance scheme has a disadvantage in that the electromagnetic resonance scheme is utilized within a limited distance and space and energy transfer efficiency is somewhat low.

The short-wavelength wireless power transfer scheme, simply an RF scheme, utilizes that energy can be directly transmitted and received in a radio wave form. This technology is an RF wireless power transfer scheme using a rectenna. Rectenna, which is a compound word of an antenna and a rectifier, means an element for directly converting RF power into DC power. That is, the RF scheme is a technology of converting an AC radio wave into DC. In recent years, research has been actively conducted on commercialization of the RF scheme with improvement in efficiency of the RF scheme.

Wireless power transfer may be variously utilized in various industries, such as IT, railway, and electric home appliance industries as well as a mobile industry.

Particularly, magnets may be provided in a wireless power transmitter and a wireless power receiver such that the transmitter can sense the receiver. The transmitter may sense a magnetic field of the receiver to determine whether to supply power to the receiver.

Conventionally, however, it is not possible for the transmitter to effectively sense the magnetic field of the receiver.

SUMMARY

Embodiments provide a wireless power transmitting apparatus, a wireless power receiving apparatus, and a wireless power transfer system using the same.

Further, embodiments provide a wireless power transmitting apparatus capable of effectively sensing a magnetic field of a receiver magnet in a wireless power transfer system.

Further, embodiments provide a wireless power transfer system capable of more effectively sensing a change of flux density using polarities of magnets.

Further, embodiments provide a wireless power transfer system capable of optimizing arrangement between a transmitter and a receiver necessary for wireless power transfer using polarities of magnets.

Further, embodiments provide a method of arranging polarities of a transmitter magnet and a receiver magnet to more effectively sense a magnetic field of the receiver magnet required to start wireless power transfer.

It should be noted that objects of the disclosure are not limited to the objects as mentioned above, and other unmentioned objects of the disclosure will be clearly understood by those skilled in the art to which the disclosure pertains from the following description.

Embodiments provide a wireless power transmitting apparatus, a wireless power receiving apparatus, and a wireless power transfer system using the same.

Further, embodiments provide a method of arranging polarities of a transmitter magnet and a receiver magnet to more effectively sense a magnetic field of the receiver magnet required to start wireless power transfer and a method of controlling the transmitter and the receiver to be rapidly arranged for wireless transfer using the same.

In one embodiment, a wireless power transmitting apparatus for wirelessly transmitting power to a wireless power receiving apparatus includes a transmitting coil for transmitting the power, a hall sensor for sensing a change width of flux density caused by the wireless power receiving apparatus, and a controller for comparing the sensed change width of the flux density with a predetermined critical value to determine whether to transmit the power, wherein magnets provided in the wireless power transmitting apparatus and the wireless power receiving apparatus are disposed such that polarities of the magnets are different from each other at opposite faces thereof.

In another embodiment, a wireless power receiving apparatus for wirelessly receiving power from a wireless power transmitting apparatus includes a receiving coil for receiving the power and a second magnet for generating flux density having a predetermined intensity at one side of a face thereof opposite to the wireless power transmitting apparatus, wherein a first magnet provided in the wireless power transmitting apparatus and the second magnet are disposed such that polarities of the magnets are different from each other at opposite faces thereof.

The above aspects of the disclosure are merely some of the preferred embodiments and various embodiments into which the technical features are incorporated may be derived and understood by those skilled in the art from the detailed description which follows.

BRIEF DESCRIPTION OF THE DRAWINGS

Arrangements and embodiments may be described in detail with reference to the following drawings in which like reference numerals refer to like elements and wherein:

FIG. 17 is a view showing internal components of a wireless power transmitting apparatus according to another embodiment.

DESCRIPTION OF SPECIFIC EMBODIMENTS

Reference will now be made in detail to the preferred embodiments, examples of which are illustrated in the accompanying drawings. The suffixes "module" and "unit" of elements herein are used for convenience of description and thus can be used interchangeably and do not have any distinguishable meanings or functions.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In the description of embodiments, a wireless power transmitting apparatus constituting a wireless power transfer system will also be referred to as a transmitter, a transmission end, a transmitting apparatus, a transmission side, or a power transmitting apparatus for the convenience of description. In addition, a wireless power receiving apparatus will also be referred to as a receiver, a terminal, a receiving side, a receiving apparatus, or a power receiving apparatus for the convenience of description.

A transmitter according to an embodiment may be configured in the form of a pad or a cradle. A transmitter may include a plurality of wireless power transmitting means, which may wirelessly transmit to a plurality of receivers.

Figure 1:
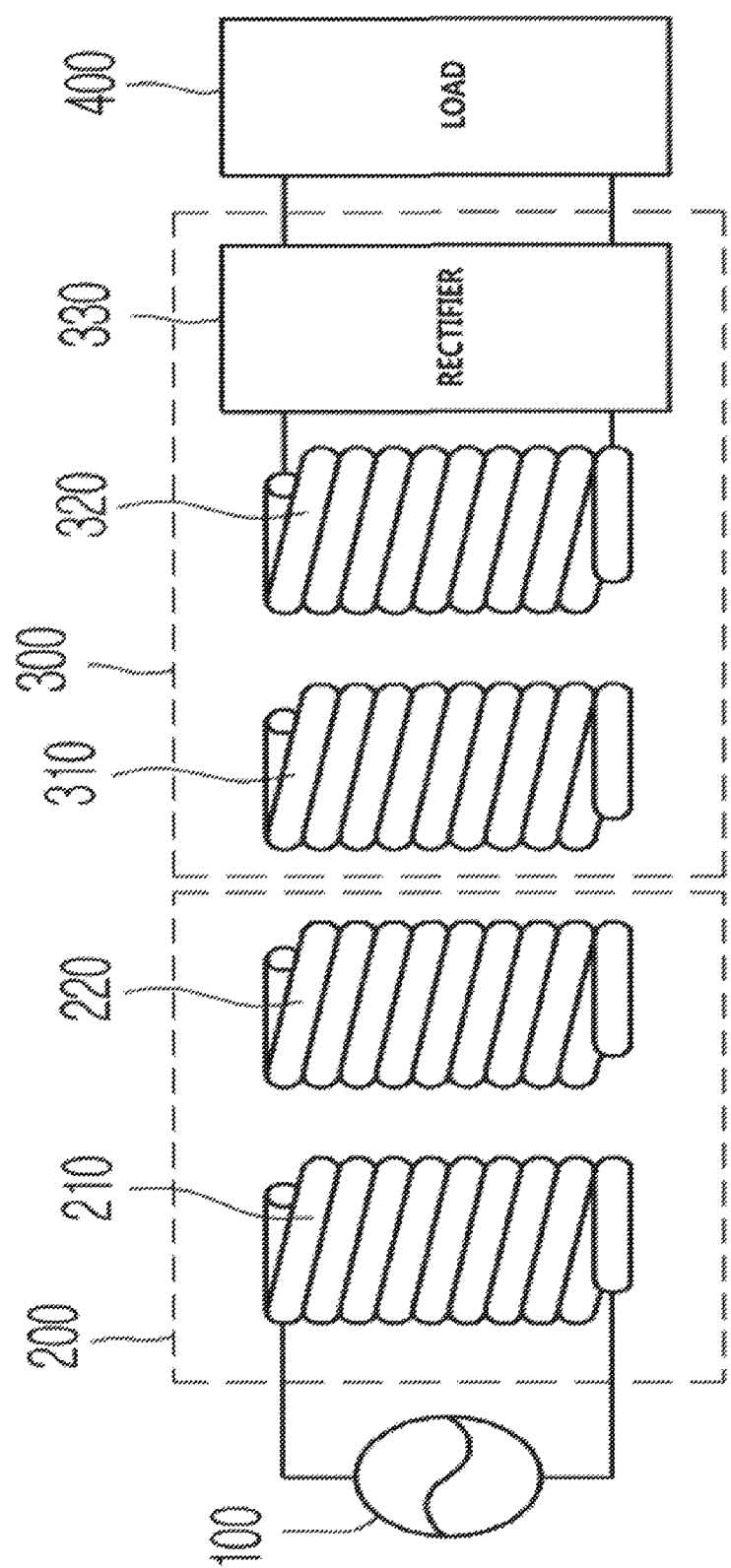
FIG. 1 is a view illustrating a wireless power transfer system according to an embodiment.

A receiver according to an embodiment may be used in a mobile phone, a smart phone, a laptop computer, a terminal for digital broadcasting, a personal digital assistant (PDA), a portable multimedia player (PMP), a navigation system, an MP3 player, and other small electronic devices. However, the disclosure is not limited thereto. The receiver may be any device having a wireless power transmitting means for charging a battery mounted therein. FIG. 1 is a view illustrating a wireless power transfer system according to an embodiment.

Referring to FIG. 1, the wireless power transfer system may include a power source 100, a wireless power transmitting apparatus 200, a wireless power receiving apparatus 300, and a load 400.

In an embodiment, the power source 100 may be included in the wireless power transmitting apparatus 200. However, the disclosure is not limited thereto.

The wireless power transmitting apparatus 200 may include a transmitting induction coil 210 and a transmitting resonance coil 220.

The wireless power receiving apparatus 300 may include a receiving resonance coil 310, a receiving induction coil 320, and a rectifier 330.

Both ends of the power source 100 may be connected to both ends of the transmitting induction coil 210.

The transmitting resonance coil 220 may be apart from the transmitting induction coil 210 by a predetermined distance.

The receiving resonance coil 310 may be apart from the receiving induction coil 320 by a predetermined distance.

Both ends of the receiving induction coil 320 may be connected to both ends of the RECTIFIER 330. The load 400 may be connected to both ends of the rectifier 330. In an embodiment, the load 400 may be included in the wireless power receiving apparatus 300.

Power generated by the power source 100 may be transferred to the wireless power transmitting apparatus 200. The power transferred to the wireless power transmitting apparatus 200 may be transferred to the wireless power receiving apparatus 300 resonating with the wireless power transmitting apparatus 200, i.e. having the same resonance frequency value as the wireless power transmitting apparatus 200, due to a resonance phenomenon.

Hereinafter, a power transfer process will be described in more detail.

The power source 100 may generate AC power having a predetermined frequency and transfer the generated AC power to the wireless power transmitting apparatus 200.

The transmitting induction coil 210 and the transmitting resonance coil 220 may be inductively coupled with each other. That is, AC current may be generated in the transmitting induction coil 210 due to the AC power supplied from the power source 100. Due to electromagnetic induction based on such AC current, the AC current may also be induced in the transmitting resonance coil 220, which is physically spaced apart from the transmitting induction coil 210.

Subsequently, the power transferred to the transmitting resonance coil 220 may be transferred to the wireless power receiving apparatus 300 having the same resonance frequency value as the wireless power transmitting apparatus 200 using a frequency resonance scheme due to resonance.

Power may be transferred between two LC circuits, impedances of which are matched with each other, due to resonance. Power transfer based on resonance may transfer power to a longer distance with higher transfer efficiency than that based on an electromagnetic induction scheme.

The receiving resonance coil 310 may receive the power transferred from the transmitting resonance coil 220 using the frequency resonance scheme. AC current may flow in the receiving resonance coil 310 due to the received power. The power transferred to the receiving resonance coil 310 may be transferred to the receiving induction coil 320 inductively coupled with the receiving resonance coil 310 due to electromagnetic induction. The power transferred to the receiving induction coil 320 may be rectified by the rectifier 330 and then transferred to the load 400.

In an embodiment, the transmitting induction coil 210, the transmitting resonance coil 220, the receiving resonance coil 310, and the receiving induction coil 320 may have a spiral structure or a helical structure. However, the disclosure is not limited thereto.

The transmitting resonance coil 220 and the receiving resonance coil 310 may be resonantly coupled with each other such that power can be transferred at a resonance frequency.

The efficiency of power transfer between the wireless power transmitting apparatus 200 and the wireless power receiving apparatus 300 may be greatly improved due to resonant coupling between the transmitting resonance coil 220 and the receiving resonance coil 310.

In the wireless power transfer system as described above, power transfer is performed based on the frequency resonance scheme.

In an embodiment, power transfer may be performed based on an electromagnetic induction scheme in addition to the frequency resonance scheme.

That is, in a case in which the wireless power transfer system performs power transfer based on electromagnetic induction, the transmitting resonance coil 220 included in the wireless power transmitting apparatus 200 and the receiving resonance coil 310 included in the wireless power receiving apparatus 300 may be omitted.

In wireless power transfer, a quality factor and a coupling coefficient may be important. That is, power transfer efficiency may be proportional to the quality factor and the coupling coefficient. As at least one selected from between the quality factor and the coupling coefficient is increased, therefore, power transfer efficiency may be improved.

The quality factor may indicate an index of energy that can be accumulated near the wireless power transmitting apparatus 200 or the wireless power receiving apparatus 300.

The quality factor may vary based on an operating frequency w, the shape, dimension, and material of a coil, etc. The quality factor may be represented by Equation 1.

$$Q=w*L/R \qquad \text{[Equation 1]}$$

Where L indicates inductance of a coil and R indicates resistance corresponding to power loss quantity caused in the coil.

The quality factor may have a value of 0 to infinity. As the quality factor is increased, the efficiency of power transfer between the wireless power transmitting apparatus 200 and the wireless power receiving apparatus 300 may be improved.

The coupling coefficient, which indicates a degree of magnetic coupling between a transmitting side coil and a receiving side coil, may have a range of 0 to 1.

The coupling coefficient may vary based on relative position of the transmitting side coil and the receiving side coil or the distance between the transmitting side coil and the receiving side coil.

Figure 2:
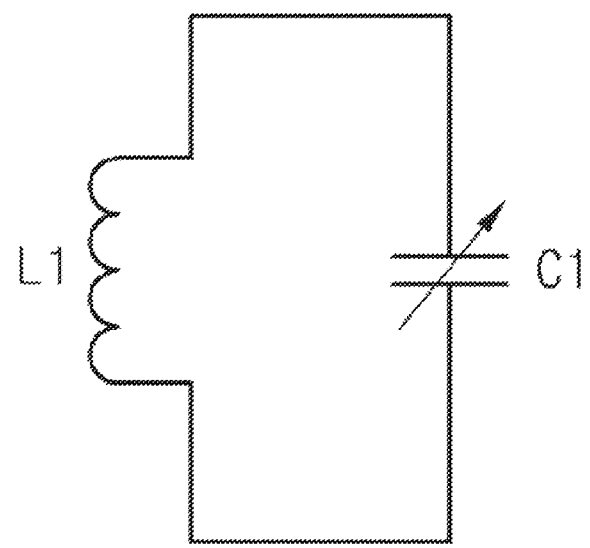
FIG. 2 is an equivalent circuit diagram of a transmitting induction coil according to an embodiment.

FIG. 2 is an equivalent circuit diagram of a transmitting induction coil according to an embodiment.

As shown in FIG. 2, the transmitting induction coil 210 may include an inductor L1 and a capacitor C1, by which the transmitting induction coil 210 may be configured as a circuit having proper inductance and capacitance values.

The transmitting induction coil 210 may be configured as an equivalent circuit in which both ends of the inductor L1 are connected to both ends of the capacitor C1. That is, the transmitting induction coil 210 may be configured as an equivalent circuit having the inductor L1 and the capacitor C1 connected in parallel.

The capacitor C1 may be a variable capacitor. As capacitance of the capacitor C1 is adjusted, impedance matching may be performed. Equivalent circuits of the transmitting resonance coil 220, the receiving resonance coil 310, and the receiving induction coil 320 may each be identical or similar to that shown in FIG. 2. However, the disclosure is not limited thereto.

Figure 3:
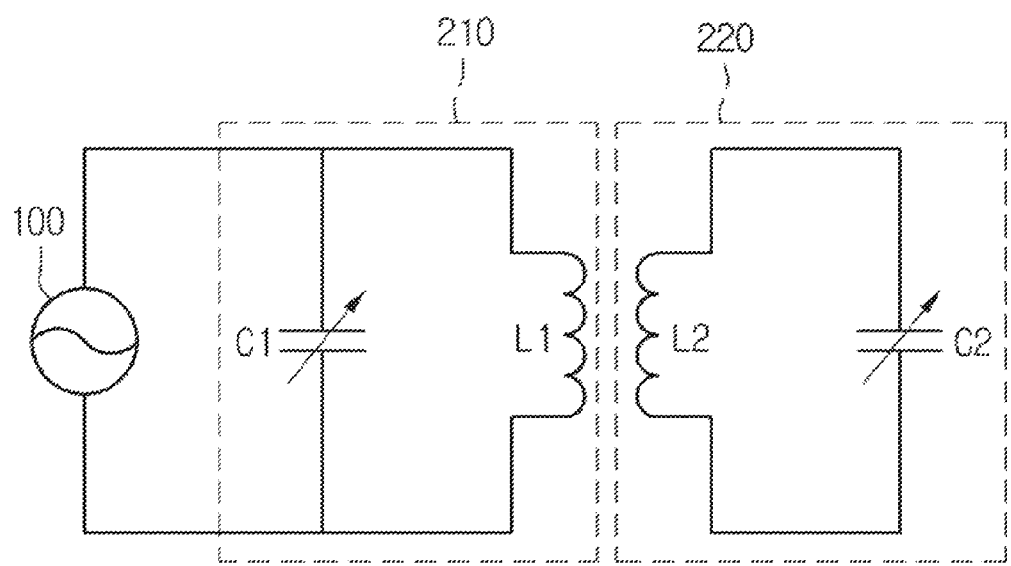
FIG. 3 is an equivalent circuit diagram of a power source and a wireless power transmitting apparatus according to an embodiment.

FIG. 3 is an equivalent circuit diagram of a power source and a wireless power transmitting apparatus according to an embodiment.

As shown in FIG. 3, the transmitting induction coil 210 and the transmitting resonance coil 220 may include inductors L1 and L2 having inductance values and capacitors C1 and C2 having capacitance values, respectively.

Figure 4:
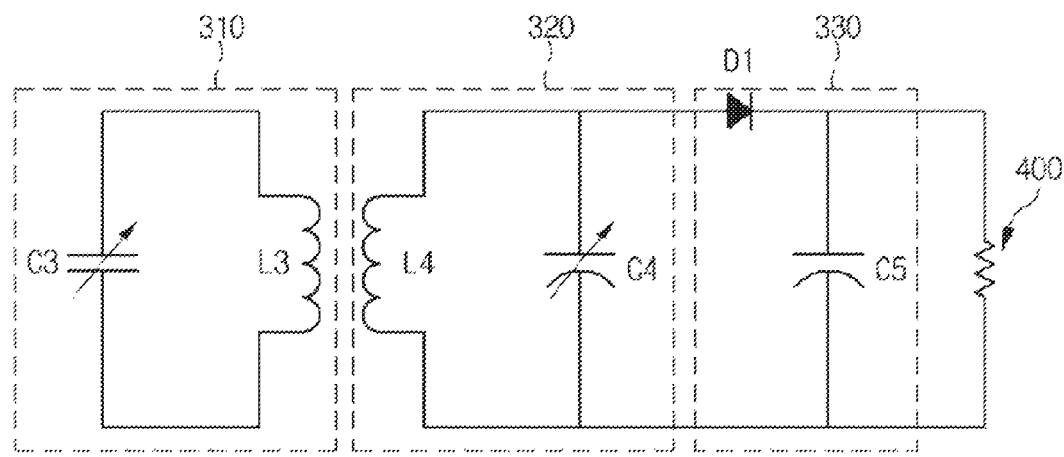
FIG. 4 is an equivalent circuit diagram of a wireless power receiving apparatus according to an embodiment.

FIG. 4 is an equivalent circuit diagram of a wireless power receiving apparatus according to an embodiment.

As shown in FIG. 4, the receiving resonance coil 310 and the receiving induction coil 320 may include inductors L3 and L4 having inductance values and capacitors C3 and C4 having capacitance values, respectively.

The rectifier 330 may convert the AC power transferred from the receiving induction coil 320 into DC power and transfer the DC power to the load 400.

Specifically, the rectifier 330 may include a rectifier and a smoothing circuit, which are not shown. In an embodiment, the rectifier may be a silicon rectifier. As shown in FIG. 4, the rectifier may be equivalent as a diode D1. However, the disclosure is not limited thereto.

The rectifier may convert the AC power transferred from the receiving induction coil 320 into DC power.

The smoothing circuit may remove an AC component from the DC power converted by the rectifier to output smooth DC power. In an embodiment, a rectification capacitor C5 may be used as the smoothing circuit as shown in FIG. 4. However, the disclosure is not limited thereto.

The DC power transferred from the rectifier 330 may be DC voltage or DC current. However, the disclosure is not limited thereto.

The load 400 may be any charging battery or device needing DC power. For example, the load 400 may be a battery.

The wireless power receiving apparatus 300 may be mounted in an electronic device, such as a mobile phone, a laptop computer, or a mouse, which needs power. Consequently, the receiving resonance coil 310 and the receiving induction coil 320 may each have a shape suitable for the electronic device.

The wireless power transmitting apparatus 200 may exchange information with the wireless power receiving apparatus 300 through in band communication or out of band communication.

The in band communication may be a communication for exchanging information between the wireless power transmitting apparatus 200 and the wireless power receiving apparatus 300 using a signal having a frequency used for wireless power transfer. To this end, the wireless power receiving apparatus 300 may further include a switch and may receive or may not receive the power transmitted from the wireless power transmitting apparatus 200 through a switching operation of the switch. Consequently, the wireless power transmitting apparatus 200 may detect power quantity consumed by the wireless power transmitting apparatus 200 to recognize an on or off signal of the switch included in the wireless power receiving apparatus 300.

Specifically, the wireless power receiving apparatus 300 may change power quantity absorbed by a resistance element using the resistance element and the switch to change power quantity consumed by the wireless power transmitting apparatus 200. The wireless power transmitting apparatus 200 may sense change of the consumed power to acquire state information of the load 400. The switch and the resistance element may be connected in series. In an embodiment, the state information of the load 400 may include information regarding current charge quantity and the change of charge quantity of the load 400. The load 400 may be included in the wireless power receiving apparatus 300.

More specifically, when the switch is opened, power absorbed by the resistance element becomes 0, and thus power consumed by the wireless power transmitting apparatus 200 decreases.

When the switch is closed, power absorbed by the resistance element becomes greater than 0, and thus power consumed by the wireless power transmitting apparatus 200 increases. When the wireless power receiving apparatus 300 repeatedly performs the above-described operation, the wireless power transmitting apparatus 200 may detect power consumed by the wireless power transmitting apparatus 200 to perform digital communication with the wireless power receiving apparatus 300.

According to the above-described operation, the wireless power transmitting apparatus 200 may receive the state information of the load 400 and transmit power suitable therefor.

On the other hand, the wireless power transmitting apparatus 200 may include a resistance element and a switch, by which state information of the wireless power transmitting apparatus 200 may be transferred to the wireless power receiving apparatus 300. In an embodiment, the state information of the wireless power transmitting apparatus 200 may include information regarding the maximum power quantity that can be transferred by the wireless power transmitting apparatus 200, the number of wireless power receiving apparatuses 300 to which the wireless power transmitting apparatus 200 provides power, and available power quantity of the wireless power transmitting apparatus 200.

Next, out of band communication will be described.

The out of band communication is a communication for exchanging information necessary for transferring power using a frequency band different from a resonance frequency band. The wireless power transmitting apparatus 200 and the wireless power receiving apparatus 300 may each be equipped with an out of band communication module, by which information necessary for transferring power therebetween may be exchanged. An out of band communication module may be mounted in the power source 100. However, the disclosure is not limited thereto. In an embodiment, the out of band communication module may use a short distance communication scheme, such as Bluetooth, Zigbee, a wireless LAN, or a near field communication (NFC). However, the disclosure is not limited thereto.

Figure 5:
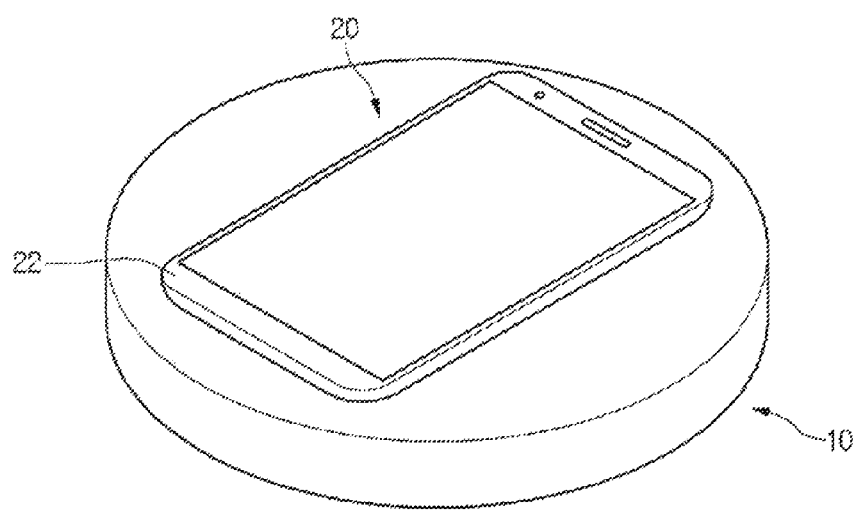
FIG. 5 is a perspective view showing a wireless power transfer system according to an embodiment.

FIG. 5 is a perspective view showing a wireless power transfer system according to an embodiment.

Referring to FIG. 5, the wireless power transfer system may include a cradle 10 and a terminal 20.

The cradle 10 may include the power source and the wireless power transmitting apparatus shown in FIG. 1. That is, the power source and the wireless power transmitting apparatus may be mounted in the cradle 10. The cradle 10 may have a circular, oval, square, or rectangular shape when viewed from above. However, the disclosure is not limited thereto.

The top of the cradle 10 may contact one surface of the terminal 20 in a surface contact manner. At least a portion of the top of the cradle 10 may have the same shape as the back of the terminal 20. However, the disclosure is not limited thereto.

The transmitting coils 210 and 220 (see FIG. 1) of the wireless power transmitting apparatus mounted in the cradle 10 may be disposed in plane opposite to the top of the cradle 10. The transmitting coils 210 and 220 may be disposed parallel to the top of the cradle 10 such that power of the transmitting coils 210 and 220 can be uniformly transferred to the terminal 20.

The terminal 20 may refer to any electronic device that includes a battery 36 for charging and performs a predetermined electronic function using power charged in battery 36. For example, the terminal 20 may include a mobile device, such as a smart phone or a tablet PC, or an electric home appliance, such as a television, a refrigerator, or a washing machine.

The terminal 20 may include the wireless power receiving apparatus and load shown in FIG. 1. That is, the wireless power receiving apparatus and load may be mounted in the terminal 20.

For charging, the terminal 20 may be placed on the top of the cradle 10. At this time, a back cover 24 of the terminal 20 may contact the top of the cradle with a front cover 22 of the terminal 20 upward. Consequently, power may be wirelessly provided from the cradle 10 such that the load is charged with the power.

Figure 6:
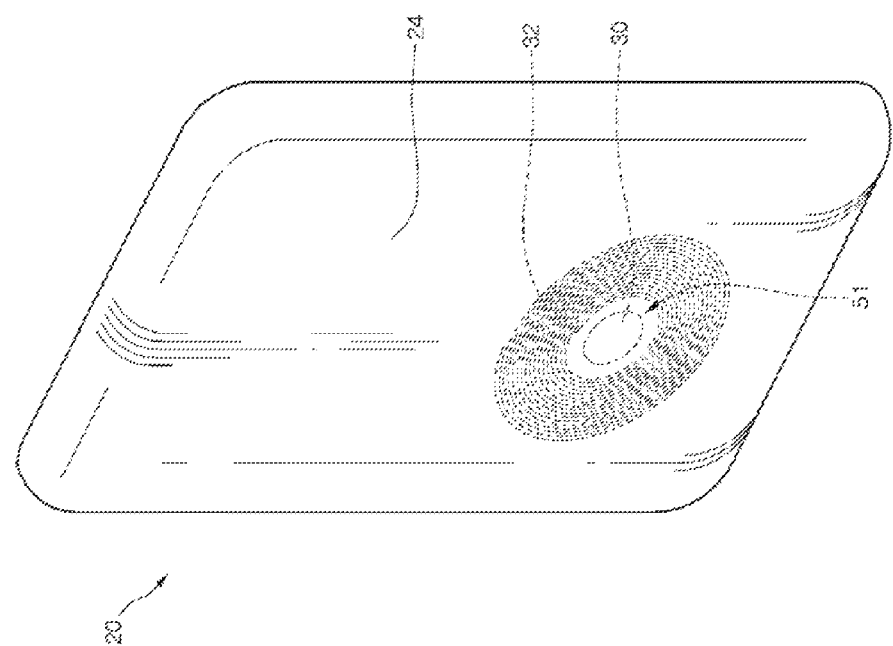
FIG. 6 is a perspective view showing the back of a terminal of FIG. 5.

As shown in FIG. 6, the receiving coil 32 and the magnet 30 may be disposed adjacent to the back of the terminal 20 corresponding to the top of the cradle 10. The receiving coil 32 may also be disposed in plane opposite to the transmitting coils 210 and 220 of the cradle 10, the top of the cradle 10, and the back cover 24 of the wireless power receiving apparatus. Particularly, when the receiving coil of the terminal 20 is positioned parallel to the transmitting coils 210 and 220 of the cradle 10, power transfer efficiency of power transferred from the transmitting coils 210 and 220 of the cradle 10 to the receiving coil 32 of the terminal 20 may be maximized.

Hereinafter, the structure of a wireless power transfer system according to an embodiment will be described in more detail with reference to FIG. 7.

Figure 7:
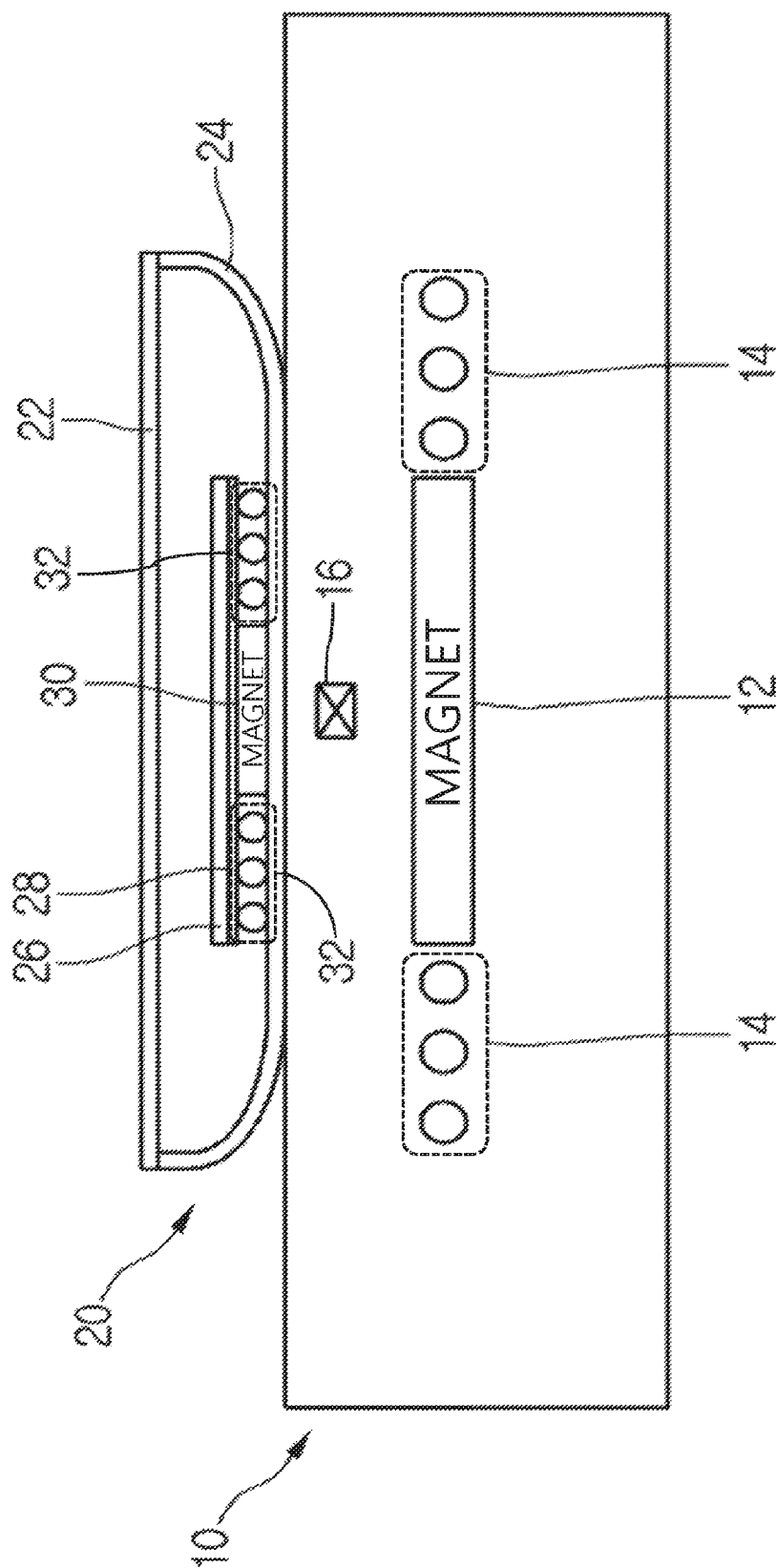
FIG. 7 is a sectional view showing a wireless power transfer system according to an embodiment.

FIG. 7 is a sectional view showing a wireless power transfer system according to an embodiment.

As shown in FIG. 7, the cradle 10 may include a transmitting coil 14 and a first magnet 12. The transmitting coil 14 and the first magnet 12 may be disposed adjacent to the top of the cradle 10. The transmitting coil 14 and the first magnet 12 may be disposed on the same plane.

The transmitting coil 14 may be the transmitting induction coil and/or the transmitting resonance coil shown in FIG. 1. For example, in a resonance scheme, both the transmitting induction coil and the transmitting resonance coil may be used. On the other hand, in an electromagnetic induction scheme, only the transmitting induction coil may be used.

The transmitting coil 14 may be disposed to surround the first magnet 12. The transmitting coil 14 has a number of turns, which are spaced apart from each other. However, the disclosure is not limited thereto. The transmitting coil 14 may be disposed parallel to an imaginary horizontal plane. The transmitting coil 14 with the above-described structure may have an empty central region.

The first magnet 12 may be disposed in the central region of the transmitting coil 14. The first magnet 12 may have a thickness equal to, greater than, or less than that of the transmitting coil 14. The thickness and area of the first magnet 12 may vary depending upon flux density necessary for the first magnet 12 and the occupied area of the first magnet 12.

The terminal 20 may include a shielding member 26, a receiving coil 32, and a second magnet 30. The receiving coil 32 and the second magnet 30 may be disposed on the same plane.

The receiving coil 32 may be the receiving resonance coil and/or the receiving induction coil shown in FIG. 1. For example, in the resonance scheme, both the receiving resonance coil and the receiving induction coil may be used. On the other hand, in the electromagnetic induction scheme, only the receiving induction coil may be used.

The receiving coil 32 may be disposed to surround the second magnet 30. The receiving coil 32 has a number of turns, which are spaced apart from each other. The receiving coil 32 may be disposed parallel to an imaginary horizontal plane. The receiving coil 32 with the above-described structure may have an empty central region.

The second magnet 30 may be disposed in the central region of the receiving coil 32. The central region of the receiving coil 32 may be less than that of the transmitting coil 14. However, the disclosure is not limited thereto. The second magnet 30 may have a thickness equal to, greater than, or less than that of the receiving coil 32. The thickness and area of the second magnet 30 may vary depending upon flux density necessary for the second magnet 30 and the occupied area of the second magnet 30.

The second magnet 30 enables approach or contact of the terminal 20 to be sensed by the cradle 10.

To this end, the cradle 10 may further include a hall sensor 16. The hall sensor 16 may be disposed between the top of the cradle 10 and the first magnet 12. However, the disclosure is not limited thereto. The hall sensor 16 may be disposed more adjacent to the top of the cradle 10 than the first magnet 12. The hall sensor 16 may be disposed in the cradle 10 between the first magnet 12 of the cradle 10 and the second magnet 30 of the terminal 20. When there is no terminal 20, the hall sensor 16 senses only flux density of the first magnet 12. On the other hand, when the terminal 20 approaches the cradle 10, the hall sensor 16 may sense flux density of the second magnet 30 as well as flux density of the first magnet 12. Consequently, the cradle 10 senses flux density of the first magnet 12 and flux density of the second magnet 30 sensed when the terminal 20 is placed on the cradle 10 based on flux density of the first magnet 12 sensed when there is no terminal 20. In a case in which a change width $\alpha$ of the flux density is equal to or greater than a critical value, it may be determined that the terminal 20 is placed on the cradle 10 for charging and the terminal 20 may be charged.

In the above embodiment, the hall sensor 16 is described as being disposed between the top of the cradle 10 and the first magnet 12. However, the disclosure is not limited thereto. In another embodiment, the hall sensor 16 may be disposed at one side of the first magnet 12 under the first magnet 12 or at one side of the transmitting coil 14 under the transmitting coil 14.

To this end, the second magnet 30 may be formed of a material causing the change width $\alpha$ of the flux density which is equal to or greater than the critical value. For example, the critical value may be 32G. In the standards, a critical value of 40G may be required.

The second magnet 30 may be formed of an electrical sheet. For example, the electrical sheet may contain 1% to 5% of silicon (Si). However, the disclosure is not limited thereto. The silicon content of the second magnet 30 may be changed to cause a change width $\alpha$ of the flux density which is equal to or greater than the critical value required in the standards or by customers.

For example, the receiving coil 32 and the second magnet 30 may be attached to the back of the shielding member 26 using an adhesive 28. On the shielding member 26 may be disposed a printed circuit board having electronic parts, including the power source, an AC power generation unit, and a controller mounted thereon.

The shielding member 26 may shield a magnetic field induced by the coil such that the magnetic field cannot affect the electronic parts, thereby preventing malfunction of the electronic parts.

Figure 8:
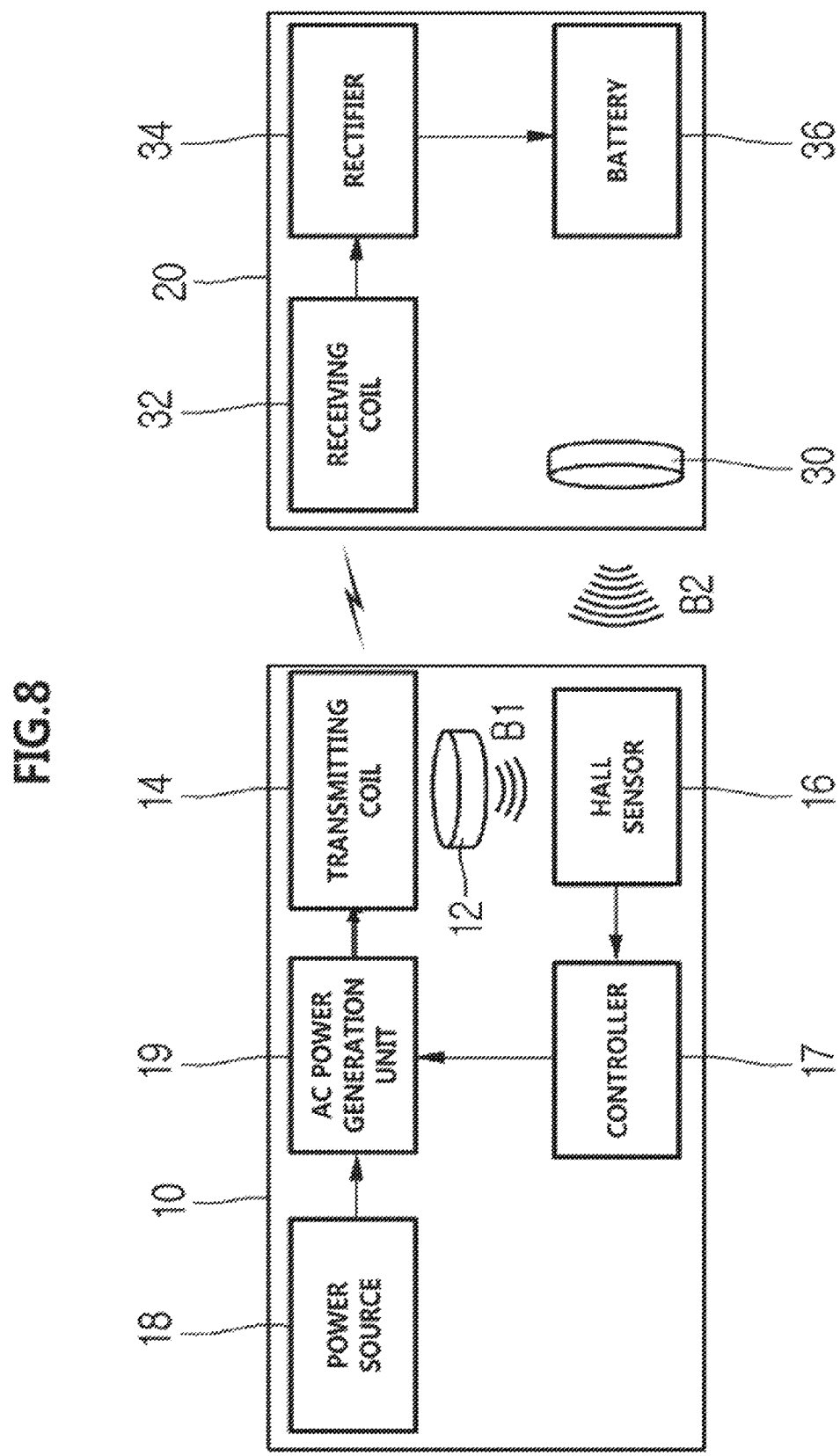
FIG. 8 is a block diagram of a wireless power transfer system according to an embodiment.

FIG. 8 is a block diagram of a wireless power transfer system according to an embodiment.

Referring to FIGS. 5 to 8, the wireless power transfer system may include a cradle 10 and a terminal 20.

The shapes of the cradle 10 and the terminal 20 were previously described. Hereinafter, circuit components mounted in the cradle 10 and the terminal 20 will be described.

The cradle 10 may include a power source, an AC power generation unit 19, a controller 17, a transmitting coil 14, a first magnet 12, and a hall sensor 16.

The power source may be the power source shown in FIG. 1, and the transmitting coil 14 may be the transmitting induction coil and/or the transmitting resonance coil shown in FIG. 1.

The power source may generate AC power or DC power. The power source may convert the AC power into first DC power and convert the converted first DC power into second DC power.

The AC power generation unit 19 may convert power from the power source into AC power under control of the controller 17. The AC power converted by the AC power generation unit 19 may be transmitted to the terminal 20 through the transmitting coil 14.

The controller 17 may control the AC power generation unit 19 based on changes in intensities of flux densities B1 and B2 detected by the hall sensor 16.

Hereinafter, detection of a voltage signal will be described with reference to FIG. 10.

Figure 10:
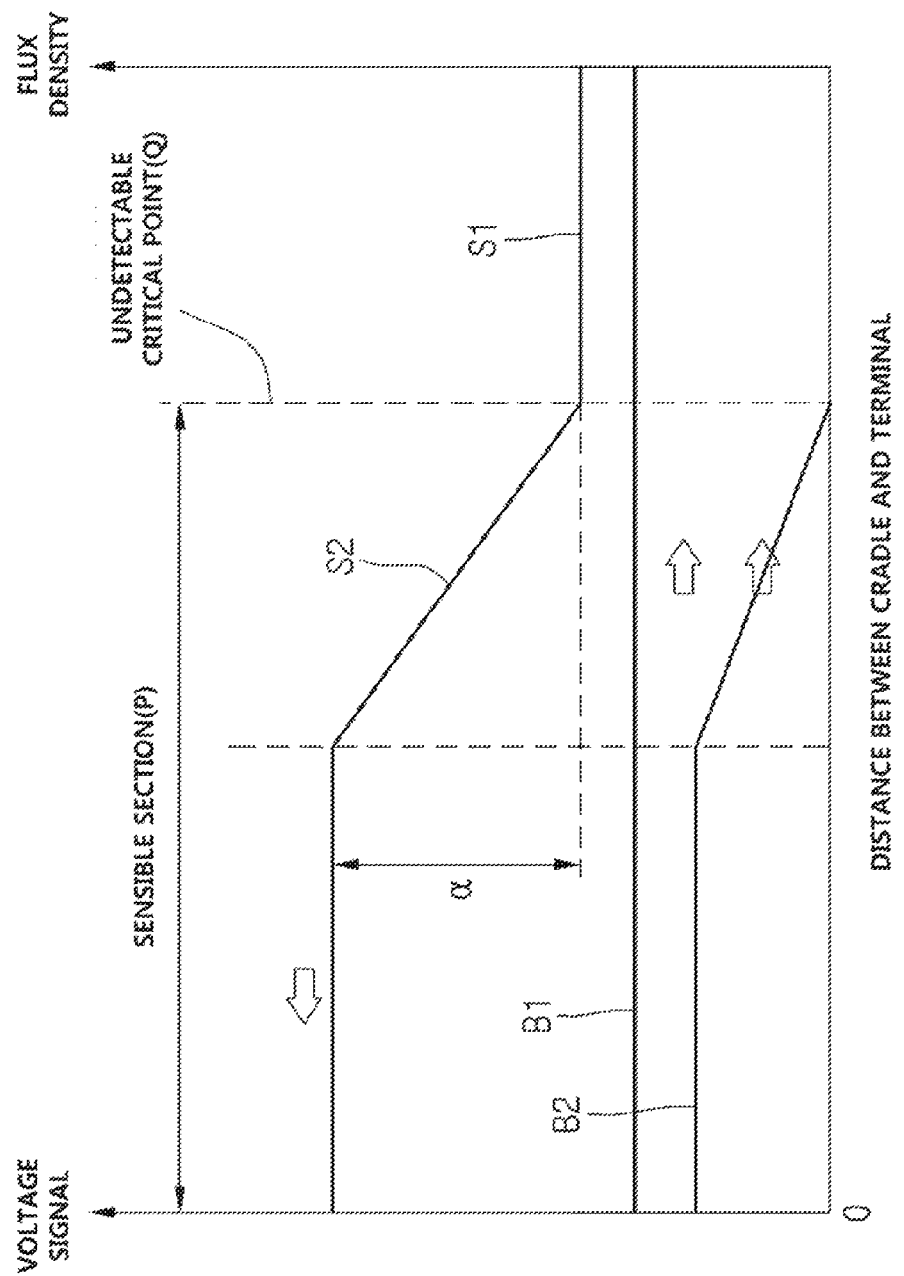
FIG. 10 is a view showing a voltage signal detected by a hall sensor based on the distance between a cradle and a terminal.

As shown in FIG. 10, the hall sensor 16 may detect flux density B1 of the first magnet 12 included in the cradle 10. In a case in which the terminal 20 is placed on the cradle 10, the hall sensor 16 may detect flux density B2 of the second magnet 30 included in the terminal 20. In the figure, the flux density B2 of the second magnet 30 is shown as being less than that of the flux density B1 of the first magnet 12. Alternatively, the flux density B2 of the second magnet 30 may be equal to or greater than that of the flux density B1 of the first magnet 12.

The hall sensor 16 may convert the flux density B1 of the first magnet 12 and the flux density B2 of the second magnet 30 into electric signals and provide the electric signals to the controller 17. For example, the electric signals may be voltage signals. However, the disclosure is not limited thereto. For example, a flux density of 1G may be converted into a voltage signal of 5 mV. For example, in a case in which the flux density B1 of the first magnet 12 is 10G, the hall sensor 16 may convert the flux density B1, which is 10G, detected from the first magnet 12 into a voltage signal of 50 mV and provide the converted voltage signal to the controller 17.

When there is no terminal 20, i.e. when the terminal 20 is located at a distance at which the flux density B2 of the second magnet 30 cannot be sensed by the hall sensor 16, a first voltage signal S1 corresponding to the flux density B1 of the first magnet 12 may be detected.

When the terminal 20 moves into a sensible section P in which the flux density B2 of the second magnet 30 of the terminal 20 can be sensed by the hall sensor 16 of the cradle 10, a second voltage signal S2 corresponding to the sum of the flux density B1 of the first magnet 12 and the flux density B2 of the second magnet 30 may be detected.

A boundary point between the distance at which the flux density B2 of the second magnet 30 cannot be sensed and the sensible section P may be defined as an undetectable critical point Q. When the distance between the terminal 20 and the cradle 10 is greater than the undetectable critical point Q, the flux density B2 of the second magnet 30 cannot be sensed by the hall sensor 16. When the distance between the terminal 20 and the cradle 10 is less than the undetectable critical point Q, i.e. within the sensible section P, the flux density B2 of the second magnet 30 can be sensed by the hall sensor 16.

The second voltage signal S2 may linearly increase as the terminal 20 approaches the cradle 10.

The second voltage signal S2 may be saturated at a predetermined point and then have a uniform level. From the predetermined point, the flux density B2 of the second magnet 30 is maximized. The flux density B2 of the second magnet 30 may be maximally maintained within a predetermined distance and gradually decrease at greater than the predetermined distance.

When the terminal 20 approaches the cradle 10 and enters a region in which the flux density B2 is the maximum, therefore, the second voltage signal S2 detected by the hall sensor 16 in this region does not increase any longer and is maintained at a uniform level. That is, since the flux density B2 cannot increase to higher than the maximum although the terminal 20 is placed on the cradle 10, the second voltage signal S2 corresponding to the sum of the flux density B2 of the second magnet 30 and the flux density B1 of the first magnet 12 may be maintained at a uniform level.

When the terminal 20 is placed on the cradle 10, i.e. the distance between the terminal 20 and the cradle 10 is 0, the second voltage signal S2 corresponding to the flux density B1 of the first magnet 12 and the flux density B2 of the second magnet 30 may be detected as a uniform level. In this case, the second voltage signal S2 may be greater than the first voltage signal S1.

The difference between the second voltage signal S2 and the first voltage signal S1 may be defined as a change width α.

For example, when the change width α between the second voltage signal S2 and the first voltage signal S1 is greater than a predetermined critical value, the controller 17 may determine that the terminal 20 is placed on the cradle 10 and control the AC power generation unit 19 to transmit AC power to the terminal 20 through the transmitting coil 14.

The terminal 230 may include a receiving coil 32, a rectifier 34, a battery 36, and a second magnet 30.

The receiving coil 32 may be the receiving resonance coil and/or the receiving induction coil shown in FIG. 1. The battery 36 may be the load shown in FIG. 1.

The receiving coil 32 may receive the AC power provided from the transmitting coil 14.

The rectifier 34 smoothes the AC power provided from the receiving coil 32, removes noise from the AC power, and converts the AC power into DC power.

The terminal 30 may further include a DC-DC converter (not shown) connected between the rectifier 34 and the battery 36 for converting the DC power converted by the rectifier 34 into rated power or rated voltage required by the battery 36.

The terminal 20 may communicate with the terminal 10 through in band communication or out of band communication to provide information regarding the increase and decrease in intensity of power required by the terminal 20 and a current charged state of the terminal 20 to the cradle 10.

Although not shown, the terminal 20 may further include a management module for sensing the received AC power or the state of the battery 36 such that overpower cannot be supplied to the battery 36 and a controller for controlling the management module and other components.

Figure 9:
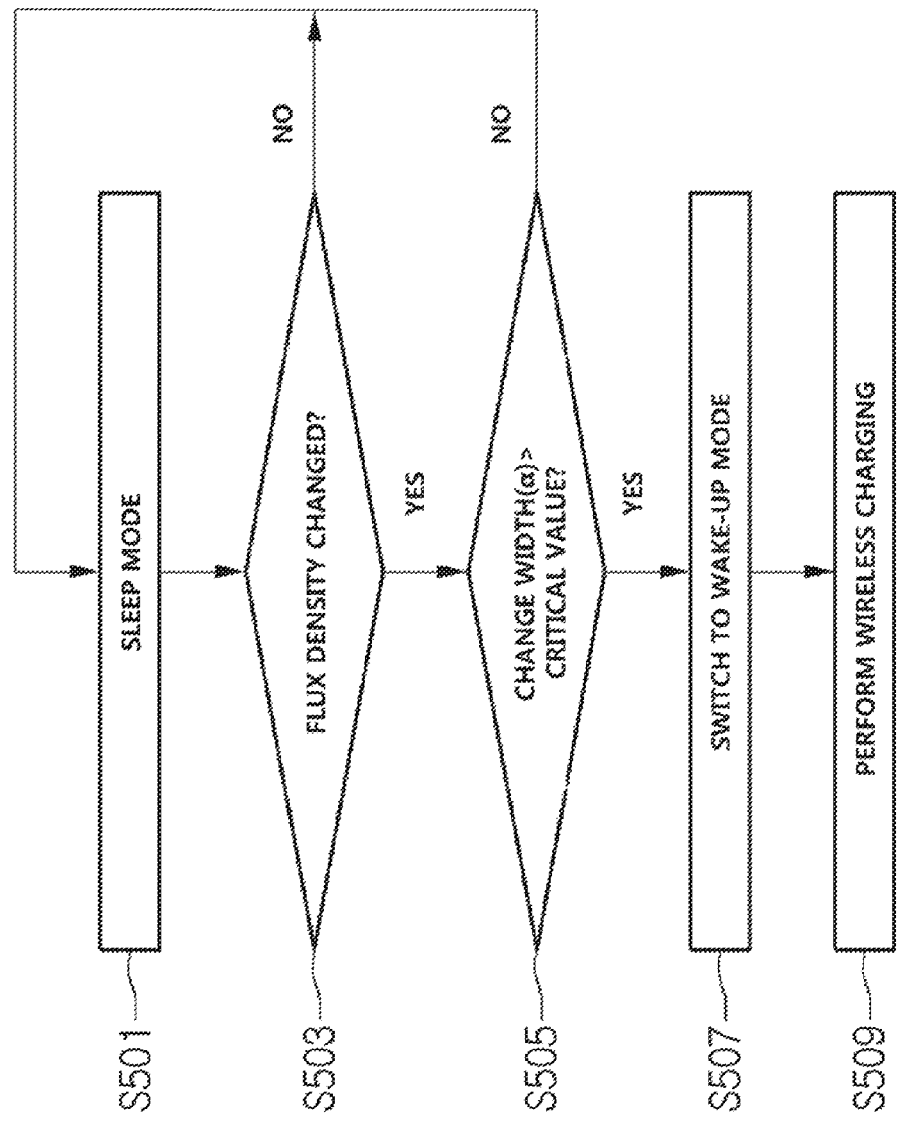
FIG. 9 is a flowchart illustrating an operation method of a wireless power transfer system according to an embodiment.

FIG. 9 is a flowchart illustrating an operation method of a wireless power transfer system according to an embodiment.

Referring to FIGS. 8 and 9, in a case in which the terminal 20 is not placed on the cradle 10, the controller 17 of the cradle 10 controls the cradle 10 to be operated in a sleep mode in which no AC power is emitted and only a requisite component, such as the hall sensor 16, is driven to minimize current consumption.

The controller 17 receives a first voltage signal S1 corresponding to flux density of the first magnet 12 from the hall sensor 16 through driving of the hall sensor 16.

The controller 17 determines whether there is a change of the flux density. That is, the controller 17 determines whether a second voltage signal S2 greater than the first voltage signal S1 provided by the hall sensor 16 is provided. As the terminal 20 approaches the cradle 10, the second voltage signal S2 detected by the hall sensor 16 may increase. The second voltage signal S2 may be a signal having flux density B2 of the second magnet 30 as well as flux density B1 of the first magnet 12 reflected therein. For example, the second voltage signal S2 may be converted from the sum of the flux density B1 of the first magnet 12 and the flux density B2 of the second magnet 30. However, the disclosure is not limited thereto.

The second voltage signal S2 may increase from the first voltage signal S1. As the terminal 20 approaches the cradle 10, therefore, a change width α between the second voltage signal S2 and the first voltage signal S1 may increase as shown in FIG. 10.

The controller 17 may determine whether the change width α between the second voltage signal S2 and the first voltage signal S1 is equal to or greater than a critical value.

Upon determining that the change width α is equal to or greater than the critical value, the controller 17 may switch the mode from the sleep mode to a wake-up mode.

The wake-up mode may be an enabling process for transmitting power to the terminal 20.

In the wake-up mode, the controller 17 performs wireless charging. That is, power is provided from the power source under control of the controller 17. The AC power generation unit 19 may generate AC power from the power of the power source. The generated AC power may be transmitted to the terminal 20 through the transmitting coil 14.

Hereinafter, an optimal disposition design structure of the second magnet 30 included in the terminal 20 will be described.

Figure 11:
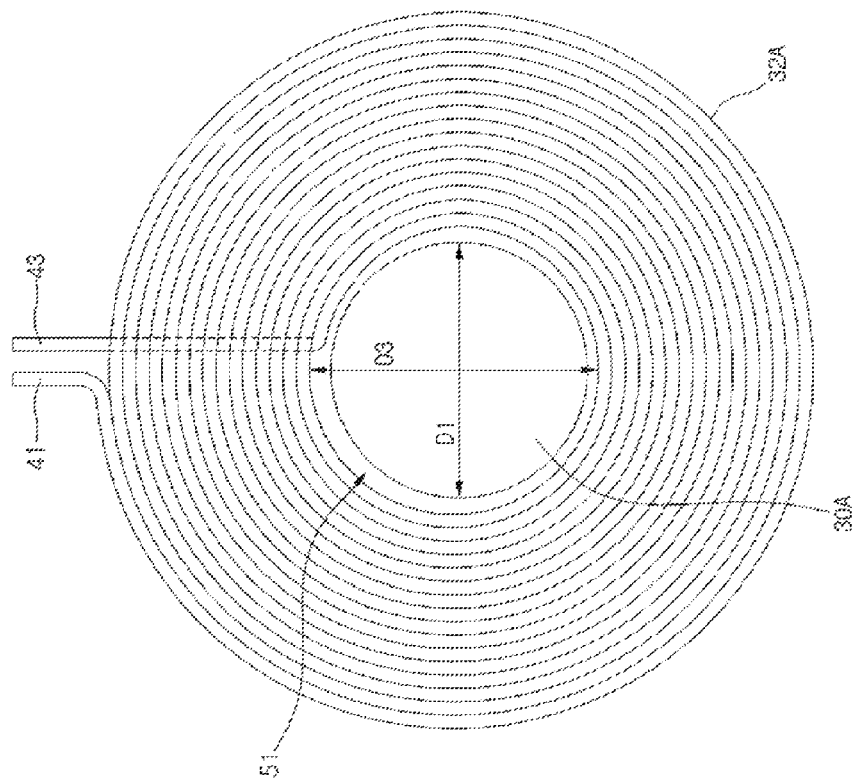
FIG. 11 is a view showing that a second magnet is disposed in a wound coil structure.
Figure 12:
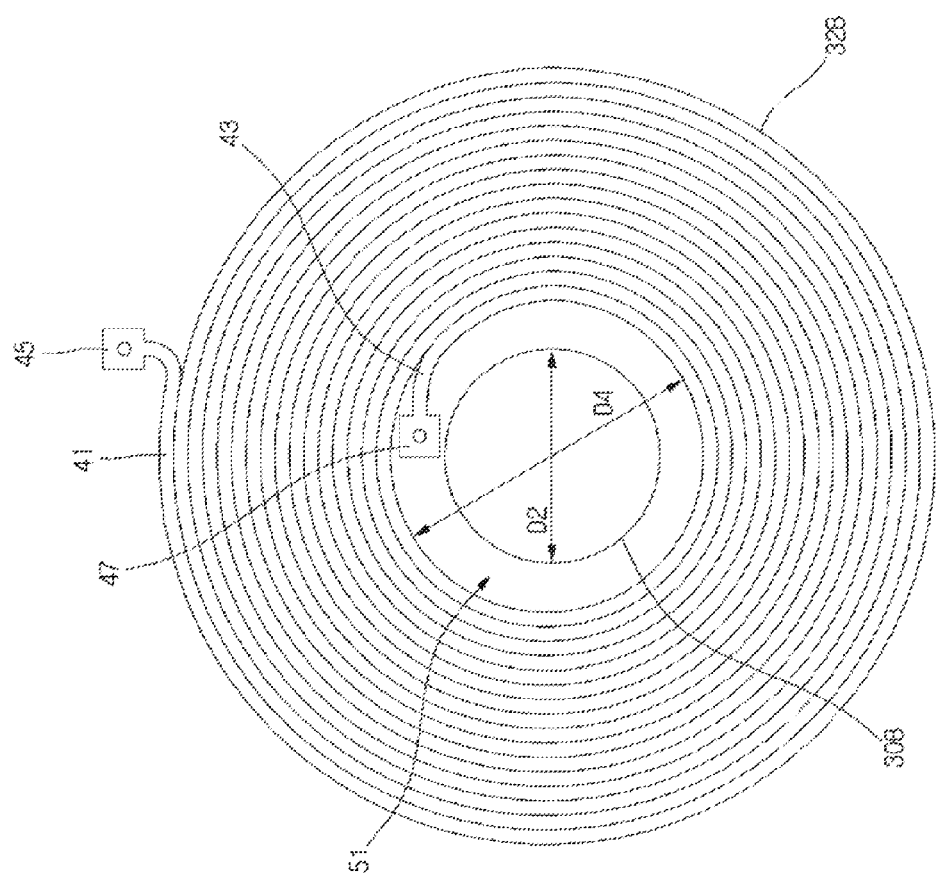
FIG. 12 is a view showing that a second magnet is disposed in a lead frame coil structure.

The receiving coil 32 of the terminal 20 may have a wound coil structure (FIG. 11) or a lead frame coil structure (FIG. 12). The receiving coil 32 may be manufactured as a flexible printed circuit board (FPCB). In a case in which the receiving coil 32 is manufactured as the FPCB, the receiving coil 32 may be manufactured to have the same shape as a lead frame coil. The FPCB is a kind of PCB. Since the FPCB is flexible, the FPCB may be three-dimensionally wired and may be reduced in size and weight. Consequently, the FPCB has attracted attention as a material capable of replacing a conventional rigid PCB and has been widely used in small or middle-sized electronic products, such as a mobile phone, a digital camera, a laptop computer, and a camcorder. In addition, the FPCB has been recently applied to various mobile devices, including a smart phone and a tablet PC.

The greatest difference between a wound coil 32A and a lead frame coil 32B is based on presence or absence of pads. That is, the wound coil 32A has no pad, whereas the lead frame coil 32B has pads 45 and 47.

The wound coil 32A may be wound from one end 41 by a predetermined number of turns such that the diameter of the coil is gradually decreased and then the other end 43 may be withdrawn near one end 41 of the wound coil 32A across the number of turns.

The lead frame coil 32B may have one end 41 connected to a first pad 45 and the other end 43 connected to a second pad 47. The lead frame coil 32B may be wound from one end 41 by a predetermined number of turns such that the diameter of the coil is gradually decreased and then the second pad 47 may be connected to the other end 43. In this case, the second pad 47 connected to the other end 43 may be disposed in the coil wound by the number of turns.

As described above, the wound coil 32A and the lead frame coil 32B each have an empty central region. The second pad 47 connected to the other end 43 of the lead frame coil 32B may be disposed in the central region of the lead frame coil 32B.

It is assumed that the diameter of the central region of the wound coil 32A is D3 and the diameter of the central region of the lead frame coil 32B is D4.

Since there is no pad in the central region of the wound coil 32A, a second magnet 30A may have a diameter D1 almost equal to the diameter D3 of the central region of the wound coil 32A.

On the other hand, since the second pad 47 is disposed in the central region of the lead frame coil 32B, a second magnet 30B may have a diameter D2 less than the diameter D4 of the central region of the lead frame coil 32B.

Consequently, the diameter D1 of the second magnet 30A disposed in the central region of the wound coil 32A may be greater than the diameter D2 of the second magnet 30B disposed in the central region of the lead frame coil 32B.

Figure 13:
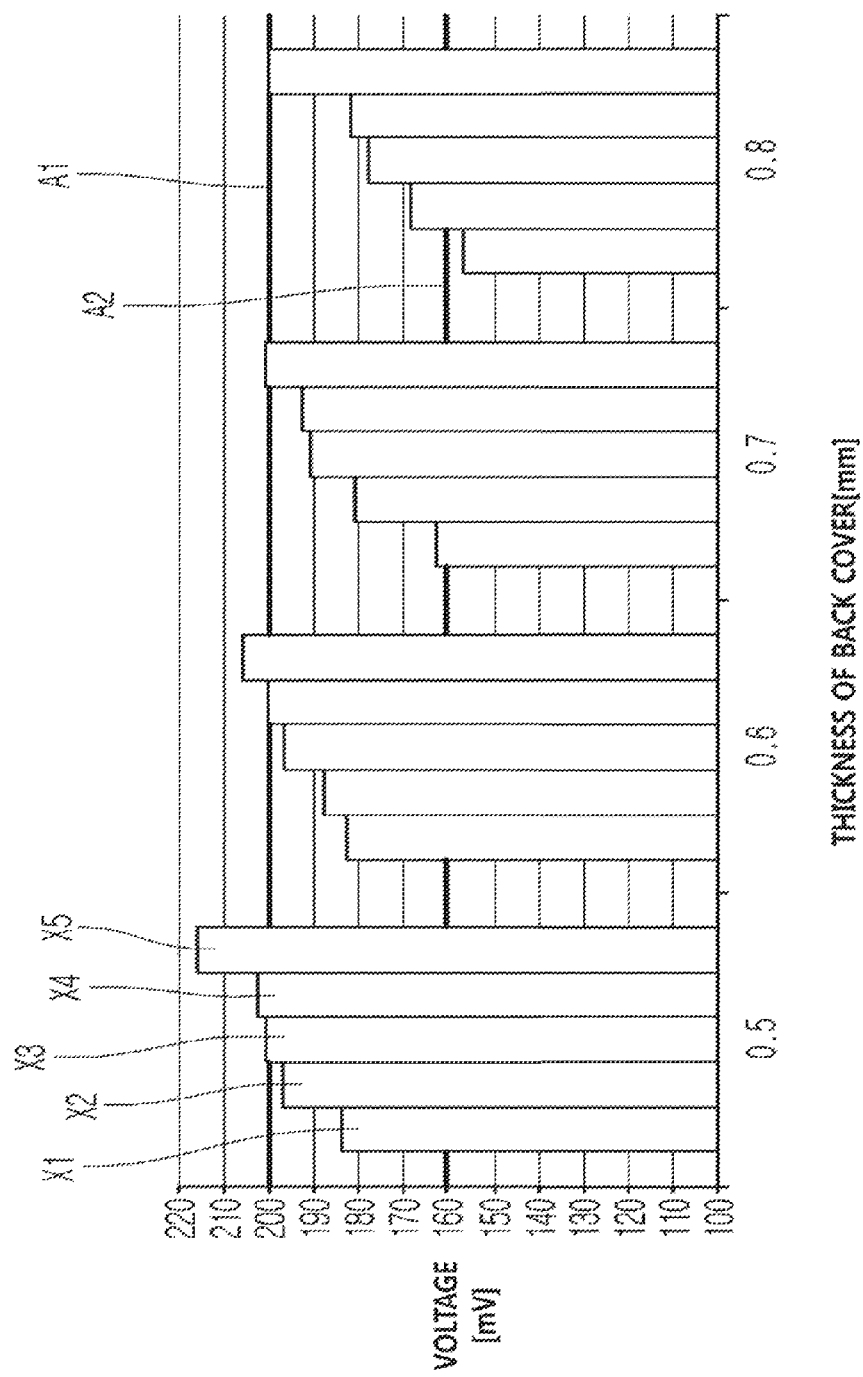
FIG. 13 is a view showing flux density based on disposition of the second magnet in the lead frame coil structure.

FIG. 13 is a view showing flux density based on disposition of the second magnet in the lead frame coil structure.

Samples as shown in Table 1 are used for experiments. The thickness of the second magnet 30B is 150 mm.

TABLE 1

| Sample | Thickness of back cover 24 [mm] | Diameter/Area of second magnet 30B [mm/mm²] | A ratio of area of second magnet 30B to available area [%] |
|---|---|---|---|
| #1 | 0.5 | 8/50 | 44 |
| #2 | 0.6 | 8/50 | 44 |
| #3 | 0.7 | 8/50 | 44 |
| #4 | 0.8 | 9/64 | 56 |
| #5 | 0.5 | 11/95 | 84 |
| #6 | 0.6 | 11/95 | 84 |
| #7 | 0.7 | 12/113 | 100 |
| #8 | 0.8 | 12/113 | 100 |

The available area, which is an area in which the second magnet 30B may be disposed, may vary depending upon whether the pad is disposed in the central region. Since the second pad 47 is disposed in the center region of the lead frame coil structure, whereas the second pad 47 is not disposed in the center region of the wound coil structure, the available area of the lead frame coil structure may be less than that of the wound coil structure. In this case, when the second magnet 30B having the same diameter is disposed, a ratio of the area of the second magnet 30B to the available area in the lead frame coil structure is greater than that in the wound coil structure.

In FIG. 13, X1 to X5 indicate diameters of the second magnet 30B. X1 indicates that the diameter of the second magnet 30B is 8 mm, and X2 indicates that the diameter of the second magnet 30B is 9 mm. In addition, X3 indicates that the diameter of the second magnet 30B is 10 mm, X4 indicates that the diameter of the second magnet 30B is 11 mm, and X5 indicates that the diameter of the second magnet 30B is 12 mm.

A horizontal axis indicates the thickness of the back cover 24 of the terminal 20, and a vertical axis indicates a voltage value converted from the flux density B2 of the second magnet 30B. The voltage value may be calculated by multiplying the flux density B2 of the second magnet 30B by 5. For example, in a case in which the flux density B2 of the second magnet 30B is 30G, the voltage value may be 150 mV.

In FIG. 13, A1, which is a preferable voltage value required in the standards, is 200 mV, and A2, which is a recommended voltage value required in the standards, is 160 mV. In order to obtain a preferable voltage value of 200 mV, it is necessary for the second magnet 30B to have a flux density B2 of 40G. In order to obtain a recommended voltage value of 160 mV, it is necessary for the second magnet 30B to have a flux density B2 of 32G.

In order to satisfy the standards, it is necessary to dispose the second magnet 30B such that the second magnet 30B has the recommended voltage value (160 mV) or more.

As shown in FIG. 13, in a case in which the back cover 24 has a thickness of 0.5 mm to 0.8 mm, the second magnet 30B has a voltage value of more than 160 mV.

In addition, in a case in which the back cover 24 has a thickness of 0.5 mm to 0.7 mm, the second magnet 30B has a voltage value of more than 160 mV when the second magnet 30B has a diameter of 8 mm to 12 mm.

In a case in which the back cover 24 has a thickness of 0.8 mm, the second magnet 30B has a voltage value of more than 160 mV when the second magnet 30B has a diameter of 9 mm to 12 mm. However, the second magnet 30B has a voltage value of less than 160 mV when the second magnet 30B has a diameter of 8 mm.

When the second magnet 30B has a diameter of 12 mm or more, the flux density B2 of the second magnet 30B may increase much more. However, as the diameter of the second magnet 30B increases, power receiving efficiency may decrease. That is, power receiving efficiency may be improved only when power transmitted from the cradle 10 is efficiently received. On the other hand, as the diameter of the second magnet 30B increases, flux density increases. However, the increasing flux density disturbs generation of current due to the receiving coil 32B of the terminal 20. As a result, the terminal 230 may not efficiently receive power from the cradle 10.

In a case in which the power receiving efficiency of the terminal 20 is guaranteed, therefore, the second magnet 30B may have a diameter of 12 mm or more. Even in this case, the maximum diameter of the second magnet 30B cannot exceed the diameter obtained based on the available area. For example, on the assumption that the available area is 130 mm$^2$, a radius r is 6.43 mm since the available area is 3.14r$^2$. Consequently, the available area may have a diameter D of 12.86 mm since D=2r.

If the power receiving efficiency of the terminal 20 is not guaranteed, the second magnet 30B may have a diameter of less than 12 mm.

Meanwhile, Table 2 shows disposition standards of the second magnet 30A in the wound coil structure.

TABLE 2

| Sample | Thickness of back cover 24 [mm] | Diameter/Area of second magnet 30A [mm/mm$^2$] | A ratio of area of second magnet 30A to available area [%] |
|---|---|---|---|
| #1 | 0.5 | 8/50 | 22 |
| #2 | 0.6 | 8/50 | 22 |
| #3 | 0.7 | 8/50 | 22 |
| #4 | 0.8 | 9/64 | 28 |
| #5 | 0.5 | 11/95 | 42 |
| #6 | 0.6 | 11/95 | 42 |
| #7 | 0.7 | 12/113 | 50 |
| #8 | 0.8 | 12/113 | 50 |

As shown in Table 2, the disposition standards of the second magnet 30A in the wound coil structure are identical to those of the second magnet 30B in the lead frame coil structure. As previously described, however, no pad is disposed in the central region of the wound coil 32A since the wound coil 32A has no pad. As a result, the central region of the wound coil 32A may be utilized only as a disposition space for the second magnet 30A. Consequently, the entirety of the central region of the wound coil 32A may be an available area. For this reason, a ratio of the area of the second magnet 30A to the available area in the wound coil structure is less than that in the lead frame coil structure. For example, as shown in Table 1, a ratio of the area of the second magnet 30B to the available area in the lead frame coil structure is 44% to 100%, whereas, as shown in Table 2, a ratio of the area of the second magnet 30A to the available area in the wound coil structure is 22% to 50%.

Although Table 2 does not show experimental data on the flux density B2 of the second magnet 30A in the wound coil structure, it is sufficiently expected that the flux density B2 of the second magnet 30A in the wound coil structure may show a tendency similar to the flux density B2 of the second magnet 30B in the lead frame coil structure.

Figure 14:
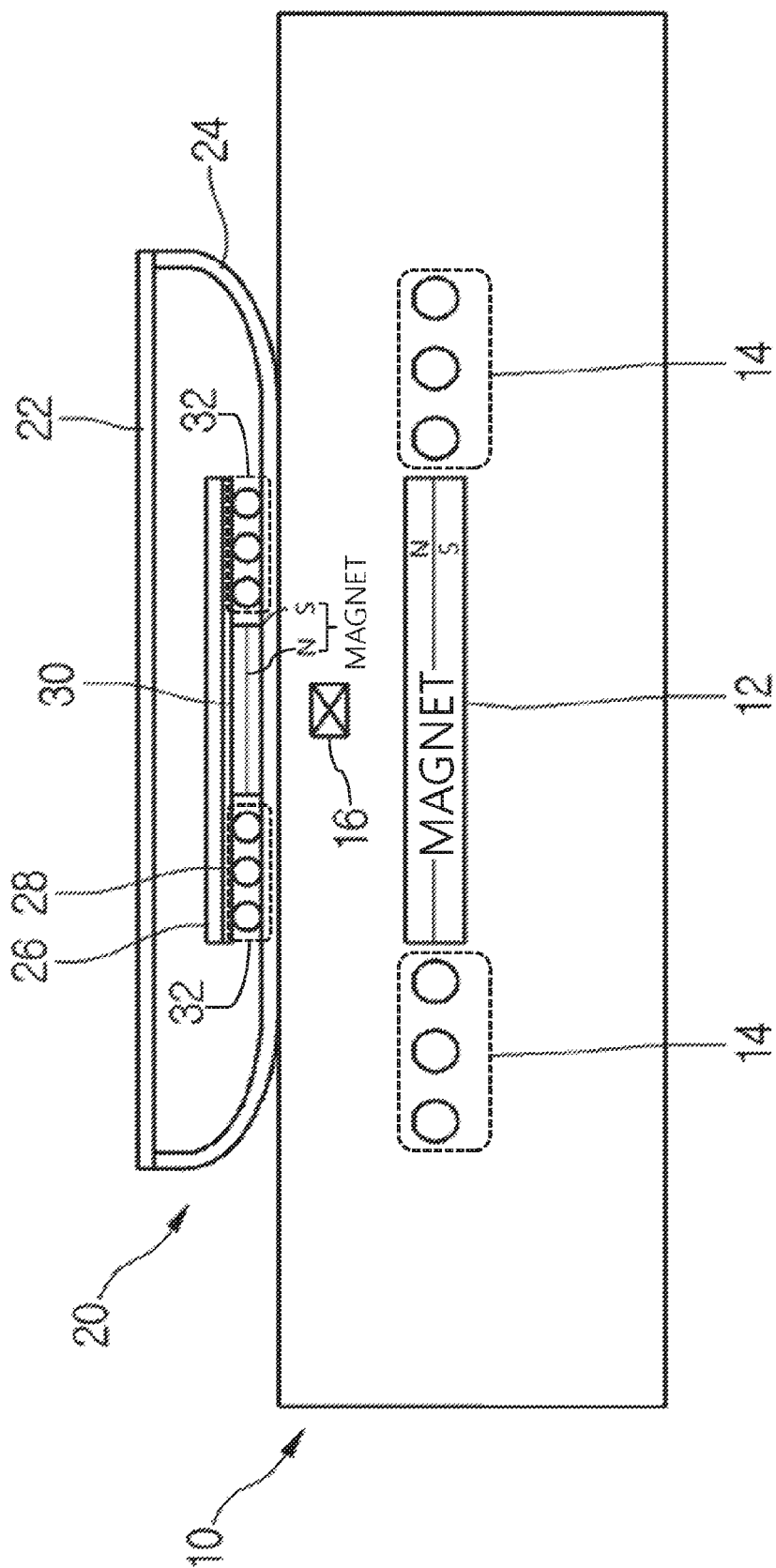
FIG. 14 is a view illustrating a polarity arrangement method of permanent magnets provided in a wireless power transmitting apparatus and a wireless power receiving apparatus according to an embodiment.

FIG. 14 is a view illustrating a polarity arrangement method of permanent magnets provided in a wireless power transmitting apparatus and a wireless power receiving apparatus according to an embodiment.

Permanent magnets having polarities (N pole and S pole) may be used as the magnets according to this embodiment. Generally, provision of magnetic force to one surface of a permanent magnet such that one surface of the permanent magnet has a specific polarity is called magnetization. When magnets are disposed in a state in which the same polarities of the magnets face each other, repulsive force is generated between the magnets. On the other hand, when magnets are disposed in a state in which opposite polarities of the magnets face each other, attractive force is generated between the magnets.

Referring to FIG. 14, polarity magnetized at the top of the first magnet 12 provided in the cradle 10 may be different from that magnetized at the bottom of the second magnet 30 of the terminal 20 facing the top of the first magnet 12. For example, the top of the first magnet 12 may be magnetized as an N pole, and the bottom of the second magnet 30 may be magnetized as an S pole. On the other hand, the top of the first magnet 12 may be magnetized as an S pole, and the bottom of the second magnet 30 may be magnetized as an N pole.

When the back cover 24 of the terminal 20 is placed on the top of the terminal 10, therefore, attractive force may be generated between the first magnet 12 and the second magnet 30.

When attractive force is generated between the first magnet 12 and the second magnet 30, a change width α of the flux density sensed by the hall sensor 16 may be higher than when repulsive force is generated between the first magnet 12 and the second magnet 30. In addition, the distance between the transmitting coil 14 and the receiving coil 32 may be reduced due to the attractive force between the first magnet 12 and the second magnet 30.

Consequently, the hall sensor 16 may more rapidly and accurately sense that the terminal 20 is placed on the cradle 10. In addition, the distance between the transmitting coil and the receiving coil 32 may be reduced due to the attractive force between the first magnet 12 and the second magnet 30, thereby improving wireless power transfer efficiency.

In FIG. 14, the polarities of the first magnet 12 and the second magnet 30 are shown as being magnetized at the top and bottom thereof. However, the disclosure is not limited thereto. In another embodiment, as shown in FIG. 15, the magnets may be magnetized in various forms.

Figure 15:
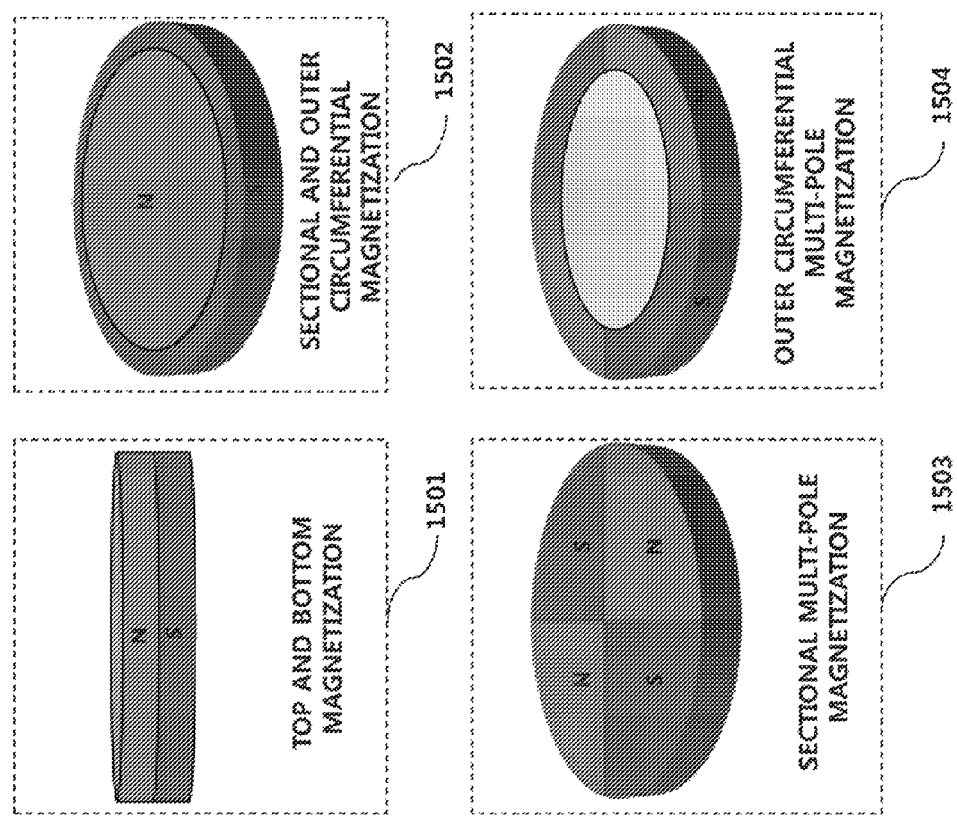
FIG. 15 is a view illustrating a magnetization method of magnets applied to a wireless power transmitting apparatus and a wireless power receiving apparatus according to an embodiment.

FIG. 15 is a view illustrating a magnetization method of magnets applied to a wireless power transmitting apparatus and a wireless power receiving apparatus according to an embodiment.

Hereinafter, a disk type magnet will be described by way of example. However, the disclosure is not limited thereto. The magnet may be configured to have a polygonal structure, such as a quadrangular shape or a diamond-shaped structure, or a donut structure.

Referring to FIG. 15, at least one selected from among a top and bottom magnetization method (1501), a sectional and outer circumferential magnetization method (1502), a sectional multi-pole magnetization method (1503), and an outer circumferential multi-pole magnetization method (1504) may be used as a magnetization method according to an embodiment.

In another embodiment, the magnetization method of the magnet applied to the wireless power transmitting apparatus 200 may be different from that of the magnet applied to the wireless power receiving apparatus 300. For example, the top and bottom magnetization method (1501) may be applied to the magnet included in the wireless power transmitting apparatus 200, and the sectional and outer circumferential magnetization method (1502) may be applied to the magnet included in the wireless power receiving apparatus 300.

The top and bottom magnetization method (1501) is a method of magnetizing a magnet such that the top and bottom of the magnet have different poles.

The sectional and outer circumferential magnetization method (1502) is a method of magnetizing a magnet such that upper and lower sections and the outer circumference of the magnet have different poles.

The sectional multi-pole magnetization method (1503) is a method of dividing the section of a magnet into a plurality of cells and magnetizing the cells such that neighboring cells have different poles.

The outer circumferential multi-pole magnetization method (1504) is a method of magnetizing the outer circumference of a magnet such that different poles are alternately disposed along the outer circumference of the magnet.

Figure 16:
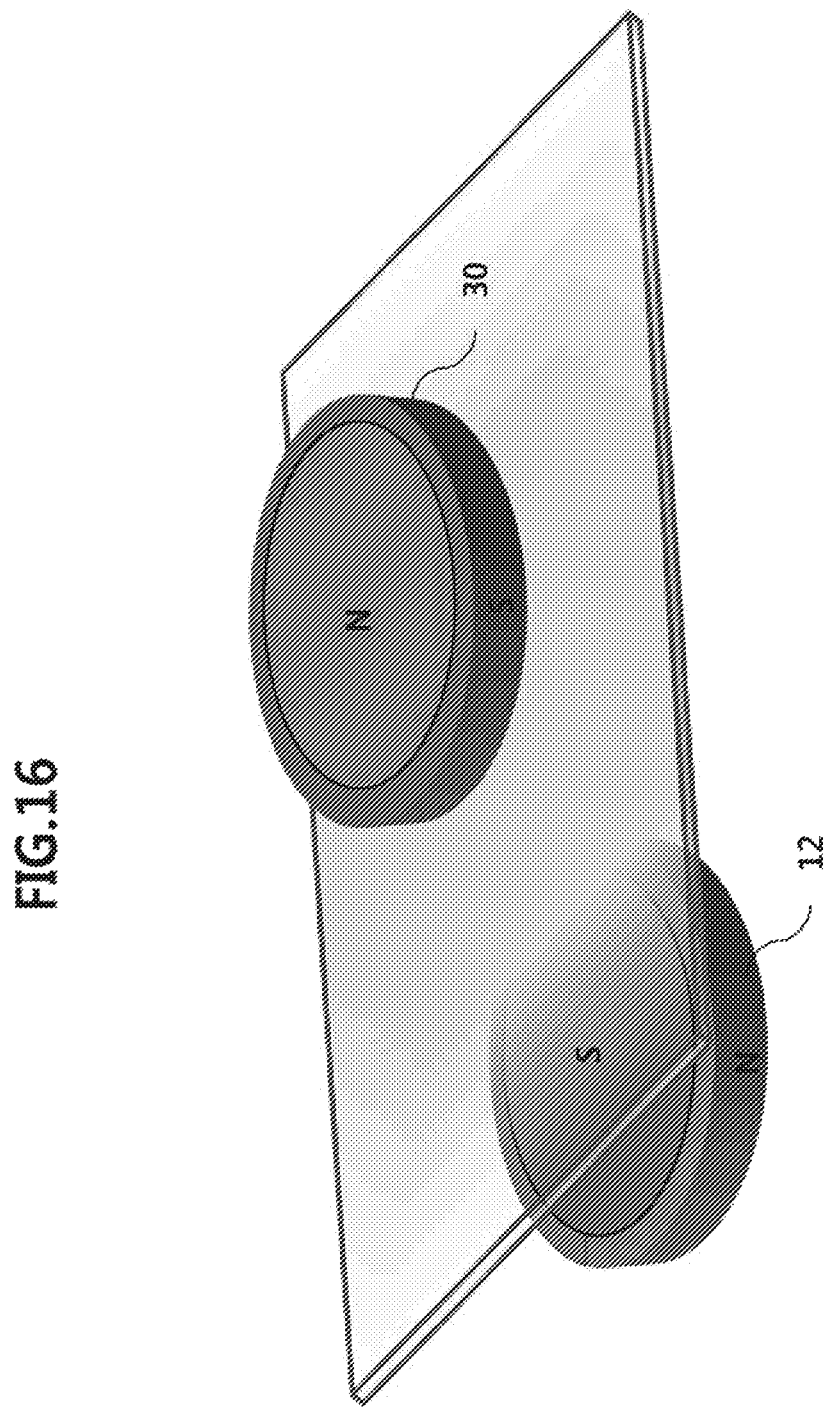
FIG. 16 is a view illustrating a polarity arrangement method of a first magnet and a second magnet in a case in which a magnet applied to an embodiment is magnetized using a sectional and outer circumferential magnetization method.

FIG. 16 is a view illustrating a polarity arrangement method of a first magnet 12 and a second magnet 30 in a case in which a magnet applied to an embodiment is magnetized using a sectional and outer circumferential magnetization method (1502).

Referring to FIG. 16, the section of the first magnet 12 may be magnetized with a first polarity, and the outer circumference of the first magnet 12 may be magnetized with a second polarity different from the first polarity. On the other hand, the section of the second magnet 30 may be magnetized with the second polarity, and the outer circumference of the second magnet 30 may be magnetized with the first polarity.

For example, a user may incorrectly place the terminal on the cradle 10 such that a change width α of the flux density sensed by the hall sensor 16 is less than a predetermined critical value. At this time, attractive force may be generated between the first magnet 12 and the second magnet 30 since the polarity of the outer circumference of the first magnet 12 is different from that of the outer circumference of the second magnet 30 and the polarity of the section of the first magnet 12 is different from that of the section of the second magnet 30. The distance between the first magnet 12 and the second magnet 30 may be reduced due to the generated attractive force. As a result, the change width α of the flux density sensed by the hall sensor 16 may increase to the predetermined critical value or more. In addition, wireless power transfer efficiency may be optimized due to the reduced distance between the first magnet 12 and the second magnet 30.

FIG. 17 is a view showing internal components of a wireless power transmitting apparatus according to another embodiment.

Referring to FIG. 17, a cradle 10 may include a plurality of hall sensors 1711 to 1713, first and second vibration modules 1721 and 1722, and a controller 1730.

In FIG. 17, first to third hall sensors 1711 to 1713 are shown. However, the disclosure is not limited thereto. In another embodiment, a larger or smaller number of hall sensors may be provided based on the size of the cradle 10 and a method of embodying the cradle 10.

In addition, only two vibration modules are shown in FIG. 17. However, a larger or smaller number of vibration modules may be provided based on the size of the cradle 10 and a method of embodying the cradle 10.

In particular, as shown in FIG. 17, it can be seen that polarities of a first magnet 12 and a second magnet 30 according to this embodiment are arranged to generate attractive force between the magnets.

The first to third hall sensors 1711 to 1713 may each measure a change width α of flux density and transfer the measured change width α of the flux density to the controller 1730. At this time, the controller 1730 may determine whether to start wireless power transfer based on the change width α of the flux density measured by each of the first to third hall sensors 1711 to 1713. In a case in which the change width α of the flux density measured by the second hall sensor 1712 above the first magnet 12 exceeds a predetermined first critical value, the controller 1730 may determine that the terminal 20 is normally placed on the cradle 10 and start wireless power transfer. On the other hand, in a case in which the change width α of the flux density measured by the second hall sensor 1712 is less than the first critical value and the change width α of the flux density measured by the first hall sensor 1711 is equal to or greater than a predetermined second critical value, the controller 1730 may drive the first vibration module 1721 to reduce the distance between the magnets. As the first vibration module 1721 is driven, the terminal 20 having the second magnet 30 may move to the first magnet 12. Afterward, the change width α of the flux density measured by the second hall sensor 1712 may exceed the first critical value.

At this time, flux density of a magnetic field generated in the first magnet 12 may be differently measured by the first hall sensor 1711 and the second hall sensor 1712 depending upon the distances from the hall sensors to the first magnet 12. Consequently, a critical value for a change width α of flux density, which may be used to determine where the terminal is placed on the cradle 10, may be differently set per hall sensor.

A critical value for a change width α of flux density per hall sensor may be preset based on a measured value of the flux density according to the distance from the first magnet 12 and the hall sensor in a state in which the terminal 20 is not placed on the cradle 10.

In a case in which magnets magnetized with polarities as described above are disposed in the cradle 10 and the terminal 20 of the wireless power transfer system, it is possible to maximize the change width α of the flux density measured by the hall sensor 16 and to minimize the distance between the magnets, thereby improving wireless power transfer efficiency.

In addition, in a case in which magnets magnetized with polarities as described above are disposed in the cradle 10 and the terminal 20 of the wireless power transfer system, it is possible to use thinner and smaller magnets, thereby reducing the volume of an electronic device equipped with the wireless power transfer system.

In FIGS. 7, 14, and 17, the hall sensor is shown as being disposed between the first magnet 12 and the top of the cradle 10. However, the disclosure is not limited thereto. In another embodiment, the hall sensor may be disposed at one side of the first magnet 12 under the first magnet 12 or at one side of the transmitting coil 14 under the transmitting coil 14.

In another embodiment, the transmitting coil 14 is wound on the outside of the first magnet 12. However, the disclosure is not limited thereto. In another embodiment, the first magnet 12 may be disposed at the upper end of the transmitting coil 14.

At this time, a predetermined shielding material for minimizing effects of a magnetic field and an electric field may be used between the first magnet 12 and the transmitting coil 14.

Hereinafter, kinds of a magnet applicable to embodiments will be described in brief. A permanent magnet applicable to embodiments may include a neodymium (Nd) magnet consisting of neodymium (Nd), iron (Fe), and boron (B), a ferrite (Fe) magnet consisting of manganese (Mn), cobalt (Co), and nickel (Ni), a rubber magnet consisting of ferrite powder and rubber, an alnico magnet using an alloy of aluminum (Al), nickel (Ni), cobalt (Co), and iron (Fe), and a samarium cobalt (Sm—Co) magnet consisting of samarium (Sm), cobalt (Co), and other rare-earth elements.

The permanent magnet may be manufactured to have various shapes, such as a disk shape, a quadrangular shape, a (circular or quadrangular) countersunk hole shape, a ring shape, a globular shape. In addition, some permanent magnets may be isotropically configured such that magnetic force can be generated from one side of each of the magnets.

The method according to the embodiments may be manufactured as a program that can be executed by a computer and may be stored in recording media readable by the computer. Examples of the recording media readable by the computer may include a read only memory (ROM), a random access memory (RAM), a compact disc read only memory (CD-ROM), a magnetic tape, a floppy disk, and an optical data storage device. In addition, the recording media readable by the computer may also be realized in the form of a carrier wave (for example, transmission through the Internet).

The recording media readable by the computer may be distributed to computer systems connected to each other through a network such that a code readable by the computer is stored or executed in a distribution mode. In addition, a functional program, code, and code segments for embodying the above method may be easily reasoned by programmers in the art to which the disclosure pertains.

As is apparent from the above description, embodiments have the following effects.

First, embodiments have an effect of providing a wireless power transmitting apparatus capable of effectively sensing a magnetic field of a receiver magnet in a wireless power transfer system.

Second, embodiments have an effect of providing a wireless power transfer system capable of more effectively sensing a magnetic field of a receiver using polarities of magnets.

Third, embodiments have an effect of providing a wireless power transfer system capable of optimizing arrangement between a transmitter and a receiver necessary for wireless power transfer using polarities of magnets.

Fourth, embodiments have an effect of providing a wireless power transfer system capable of vertically and horizontally arranging a transmitting coil of a transmitter and a receiving coil of a receiver using polarities of magnets, thereby maximizing wireless power transfer efficiency.

Fifth, embodiments have an effect of defining polarity arrangement of a magnet provided in a transmitter of a wireless power transfer system, thereby standardizing the structure of a receiver per manufacturer.

Sixth, embodiments have an effect in which it is possible to use thinner and smaller magnets through polarity arrangement of magnets provided in a transmitter and a receiver of a wireless power transfer system, thereby reducing the volume of an electronic device equipped with the wireless power transfer system.

Effects obtainable from embodiments may not be limited by the above mentioned effects, and other unmentioned effects can be clearly understood from the following description by those having ordinary skill in the technical field to which the disclosure pertains.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A wireless power transmitting apparatus for wirelessly transmitting power to a wireless power receiving apparatus, the wireless power transmitting apparatus comprising:
    a transmitting coil for transmitting the power;
    a hall sensor for sensing a change width of flux density caused by the wireless power receiving apparatus; and
    a controller for comparing the sensed change width of the flux density with a predetermined critical value to determine whether to transmit the power, wherein magnets provided in the wireless power transmitting apparatus and the wireless power receiving apparatus are disposed such that polarities of the magnets are different from each other at opposite faces thereof, and wherein the hall sensor is disposed between the magnets of the wireless power transmitting apparatus and the wireless power receiving apparatus.

2. The wireless power transmitting apparatus according to claim 1, further comprising a first magnet for generating flux density having a predetermined intensity, wherein the critical value is set based on a distance between the first magnet and the hall sensor.

3. The wireless power transmitting apparatus according to claim 2, wherein the hall sensor comprises at least one hall sensor, and the critical value is differently set based on a distance between each hall sensor and the first magnet.

4. The wireless power transmitting apparatus according to claim 3, further comprising at least one vibration module for vibrating one side of a top of the wireless power transmitting apparatus, wherein the controller controls driving of the vibration module based on the change width of the flux density measured by the at least one hall sensor.

5. The wireless power transmitting apparatus according to claim 2, wherein the hall sensor is provided between a top of the wireless power transmitting apparatus and the first magnet.

6. The wireless power transmitting apparatus according to claim 2, wherein the first magnet is disposed in a central region of the transmitting coil.

7. The wireless power transmitting apparatus according to claim 2, wherein
the wireless power receiving apparatus comprises a second magnet, and
the hall sensor senses flux density of the first magnet and flux density of the second magnet to calculate the change width of the flux density.

8. The wireless power transmitting apparatus according to claim 2, wherein the first magnet is a permanent magnet magnetized only at a face thereof opposite to the wireless power receiving apparatus.

9. The wireless power transmitting apparatus according to claim 2, wherein the first magnet is a permanent magnet magnetized using any one selected from among a top and bottom magnetization method, an outer circumferential magnetization method, a sectional multi-pole magnetization method, and an outer circumferential multi-pole magnetization method.

* * * * *